United States Patent

Iwase

(10) Patent No.: US 9,269,828 B2
(45) Date of Patent: Feb. 23, 2016

(54) LATERAL CHARGE STORAGE REGION FORMATION FOR SEMICONDUCTOR WORDLINE

(75) Inventor: Shin Iwase, Fukushima_ken (JP)

(73) Assignee: Cypress Semiconductor Corporation, San Jose, CA (US)

( * ) Notice: Subject to any disclaimer, the term of this patent is extended or adjusted under 35 U.S.C. 154(b) by 737 days.

(21) Appl. No.: 12/180,306

(22) Filed: Jul. 25, 2008

(65) Prior Publication Data

US 2009/0184361 A1    Jul. 23, 2009

(30) Foreign Application Priority Data

Jul. 25, 2007    (JP) .................................. 2007-193555

(51) Int. Cl.
| | |
|---|---|
| H01L 27/108 | (2006.01) |
| H01L 29/792 | (2006.01) |
| H01L 27/115 | (2006.01) |
| H01L 29/423 | (2006.01) |

(52) U.S. Cl.
CPC ............ *H01L 29/792* (2013.01); *H01L 27/115* (2013.01); *H01L 27/11568* (2013.01); *H01L 29/4234* (2013.01)

(58) Field of Classification Search
CPC .................. H01L 29/66833; H01L 29/66795; H01L 29/792
USPC ........... 438/259, 216, 270, 287; 257/324, 316
See application file for complete search history.

(56) References Cited

U.S. PATENT DOCUMENTS

| | | | | |
|---|---|---|---|---|
| 5,334,548 | A * | 8/1994 | Shen et al. ..................... | 438/246 |
| 6,060,739 | A * | 5/2000 | Saitoh ........................... | 257/314 |
| 6,172,395 | B1 * | 1/2001 | Chen et al. .................... | 257/315 |
| 6,191,448 | B1 * | 2/2001 | Forbes et al. ................. | 257/330 |
| 7,141,838 | B1 * | 11/2006 | Brennan ........................ | 257/241 |
| 7,423,310 | B2 * | 9/2008 | Verhoeven .................... | 257/308 |
| 7,541,242 | B2 * | 6/2009 | Prall et al. .................... | 438/259 |
| 7,566,974 | B2 * | 7/2009 | Konevecki et al. ........... | 257/754 |
| 7,589,371 | B2 * | 9/2009 | Hosaka et al. ................ | 257/314 |
| 7,674,661 | B2 * | 3/2010 | Ahn et al. ..................... | 438/156 |
| 7,709,334 | B2 * | 5/2010 | Lai et al. ....................... | 438/287 |
| 7,767,517 | B2 * | 8/2010 | Lee et al. ...................... | 438/242 |
| 2004/0266206 | A1 * | 12/2004 | Cleeves ........................ | 438/719 |
| 2006/0071259 | A1 * | 4/2006 | Verhoeven ........ | H01L 21/76895 257/299 |
| 2008/0061361 | A1 * | 3/2008 | Lee et al. ...................... | 257/324 |
| 2008/0224275 | A1 * | 9/2008 | Hayakawa et al. ........... | 257/637 |
| 2008/0266949 | A1 * | 10/2008 | He et al. ..................... | 365/185.05 |
| 2009/0168532 | A1 * | 7/2009 | Sel et al. .................... | 365/185.17 |
| 2009/0209076 | A1 * | 8/2009 | Higashi ......................... | 438/287 |
| 2010/0059849 | A1 * | 3/2010 | Quddus ......................... | 257/476 |

FOREIGN PATENT DOCUMENTS

| | | |
|---|---|---|
| JP | 2001-501034 A | 1/2001 |
| JP | 2005-102436 A | 4/2005 |
| JP | 2006-187897 A | 7/2006 |
| JP | 2006-187897 A | 1/2008 |
| WO | WO-2007-026494 A1 | 3/2007 |

* cited by examiner

*Primary Examiner* — Bradley K Smith
*Assistant Examiner* — David Goodwin

(57) ABSTRACT

Devices and methods for forming charge storage regions are disclosed. In one embodiment, a semiconductor device comprises a semiconductor layer having a trench, charge storage layers formed at both side surfaces of the trench, a wordline buried in the trench in contact with the charge storage layers, and source-drain regions formed in the semiconductor layer at both sides of the trench.

17 Claims, 14 Drawing Sheets

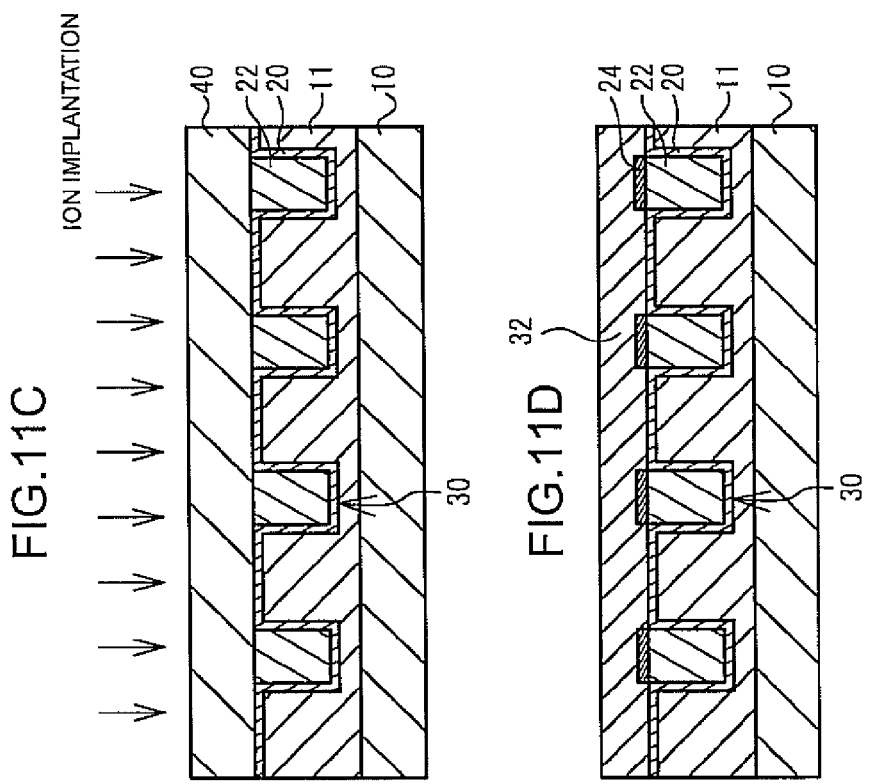
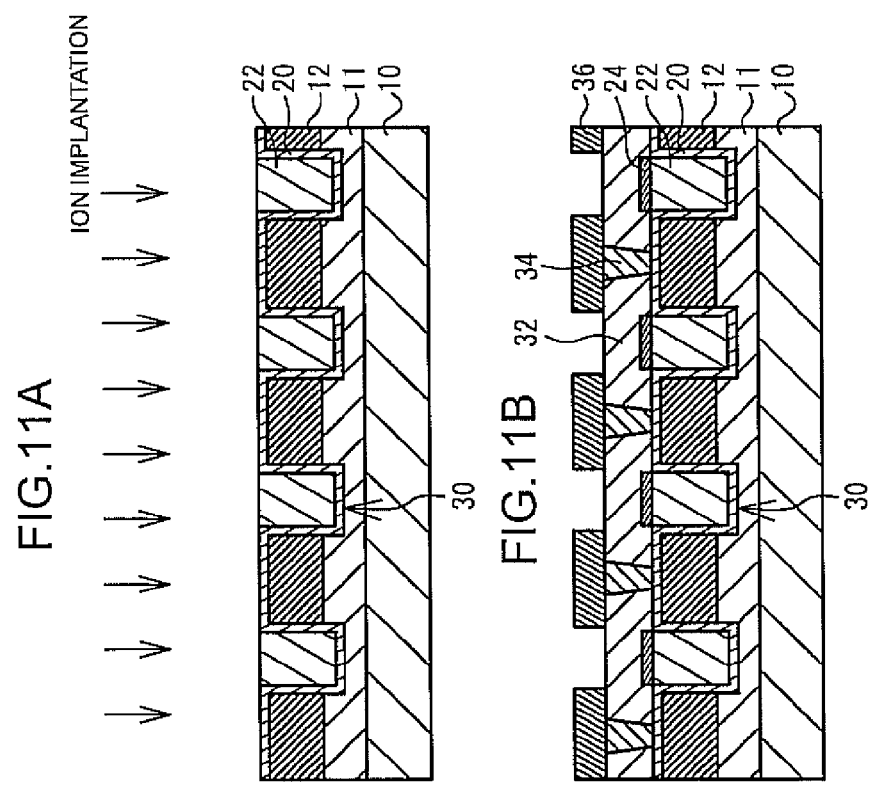

LATERAL CHARGE STORAGE REGION FORMATION FOR SEMICONDUCTOR WORDLINE

CLAIM OF PRIORITY

This application claims priority from Japanese patent application 2007-193555 filed on Jul. 25, 2007.

FIELD OF TECHNOLOGY

The present invention relates to semiconductor devices and methods, particularly to data storage layers of semiconductor memory devices.

BACKGROUND

A charge storage layer of a flash memory is used to store data by trapping electrons. The charge storage layer includes a silicon-oxide-nitride-oxide silicon (SONOS) type structure which stores the electrons in a trap layer made of an oxide-nitride-oxide (ONO) film. U.S. Pat. No. 6,011,725 is a related art which discloses a flash memory with the SONOS type structure, where each transistor of the flash memory can store two data bits by forming two charge storage regions between each source and drain which is interchangeable.

FIG. 1 is a top view of the flash memory as described in the related art. In FIG. 1, bit lines 60 are buried in a semiconductor substrate 10. Wordlines 62 are provided on the semiconductor substrate 10 via an ONO film (not shown). The wordlines 62 intersect the bit lines 60. The portion of the semiconductor substrate 10 below the wordlines 62 and between the bit lines 60 serves as a channel. Each of the bit lines 60 can serve as a source or a drain of the flash memory, whereas each of the wordlines 62 serves as a gate. A high electric field is applied between the bit line 60 (BL1), which functions as the source, and the bit line 60 (BL2), which functions as the drain, so that electrons are stored in the charge storage region C01 in the ONO film. Meanwhile, the electrons may be stored in the charge storage region C02 by switching the source and drain of the flash memory. The symmetrical operation of the source and the drain makes it possible to form two charge storage regions (e.g., C01 and C02) in the ONO film between the source and the drain. Thus, two bits can be stored in a single transistor of the flash memory.

However, as the width of the wordline 62 is shortened to reduce the size of the flash memory, the widths of the charge storage regions C01 and C02 in the ONO film also need to be reduced. The reduction of the widths may decrease the charge quantity of the electrons stored in the charge storage regions C01 and C02. For example, if the width of either C01 or C02 becomes 0.2 um or less, a charge loss in each region due to the reduction may become significant. It is therefore a reason which prevents chip makers from further reducing the size of the flash memory.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One embodiment of the present invention is directed to a semiconductor device which comprises a semiconductor layer having a trench, charge storage layers formed at both side surfaces of the trench, a wordline buried in the trench in contact with the charge storage layers, and source-drain regions formed in the semiconductor layer at both sides of the trench.

Another embodiment of the present invention is directed to a method for manufacturing a semiconductor device which comprises forming multiple trenches in a semiconductor layer, forming charge storage layers on both side surfaces of each trench, forming multiple source-drain regions in the semiconductor layer at both sides of the each trench, and burying wordlines in the trenches.

As will be illustrated in the detailed description, other embodiments pertain to systems, methods, and devices for laterally forming charge storage layers along wordlines. By forming the charge storage layers on the sides of individual wordlines rather than across them, the width of each wordline can be scaled down without affecting the function of its respective charge storage layers. This can be achieved by first forming the charge storage layers on both side surfaces of each wordline and by forming multiple source-drain regions at both sides of each wordline.

BRIEF DESCRIPTION OF THE DRAWINGS

Example embodiments are illustrated by way of example and not limitation in the figures of the accompanying drawings, in which like references indicate similar elements and in which:

FIG. 11A through FIG. 11D are sectional views illustrating exemplary steps of manufacturing a flash memory, according to one embodiment.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments pertain to systems, methods, and devices for laterally forming charge storage layers along wordlines. By forming the charge storage layers on the sides of individual wordlines rather than across them, the width of each wordline can be scaled down without affecting the function of its respective charge storage layers. This can be achieved by first forming the charge storage layers on both side surfaces of each wordline and by forming multiple source-drain regions at both sides of each wordline.

Figure 1:
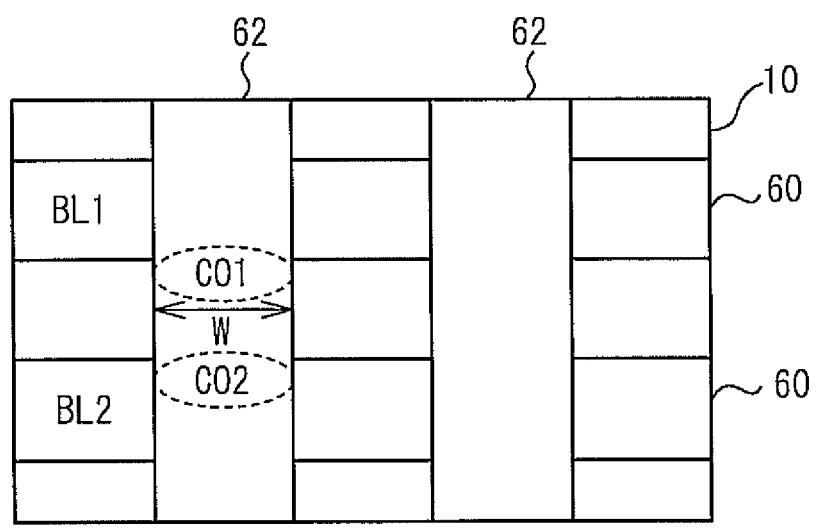
FIG. 1 is a top view of a conventional flash memory.
Figure 2:
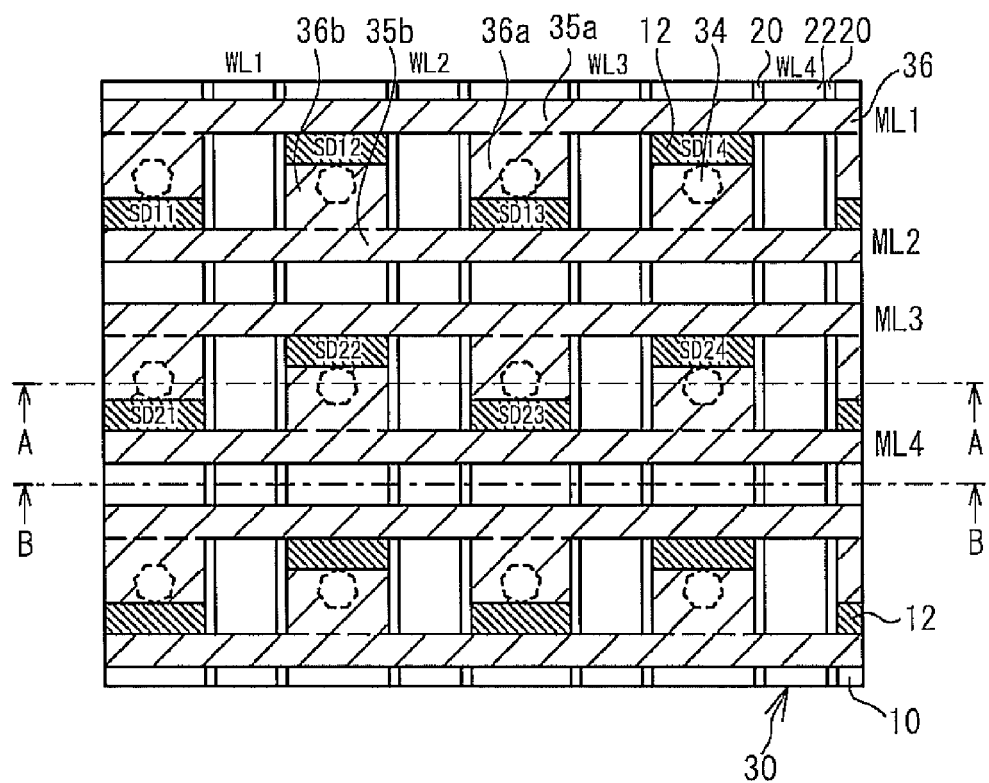
FIG. 2 is a perspective view of an exemplary flash memory, according to one embodiment.

FIG. 2 is a perspective view of an exemplary flash memory, according to one embodiment. In FIG. 2, trenches 30, which are formed in a P-type silicon semiconductor substrate 10 (or P-type region in the semiconductor substrate 10) extend in the longitudinal direction. The trench 30 contains wordlines 22 (e.g., WL1 to WL4). Interconnection layers 36 extend to intersect the wordlines 22. The interconnection layers 36 include pad portions 36a and 36b to connect to plug metals 34. The pad portions 36a (first pad portion) provided for an ML1 of the interconnection layer 36 and the pad portions 36b (second pad portion) provided for an ML2 of the interconnection layer 36 are alternately formed above the source-drain region 12. The interconnection layers 36 are alternately connected to the source-drain region 12 via the plug metals 34. In other words, the ML1 and the ML2 are connected to the source-drain region 12 across two wordlines 22. That is, the ML1 as the interconnection layer 36 is connected to SD11 and SD13 of the source-drain region 12. The ML2 is connected to SD12 and SD14. Likewise, the ML3 as the interconnection layer 36 is connected to SD21 and SD23, and the ML4 is connected to SD22 and SD24.

Figure 3A:
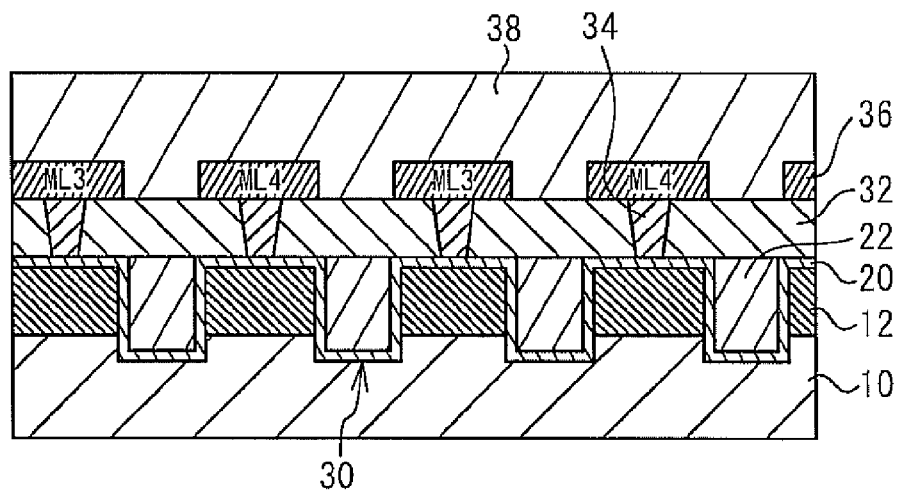
FIG. 3A is a sectional view the source-drain region 12 of FIG. 2 taken along line A-A.
Figure 3B:
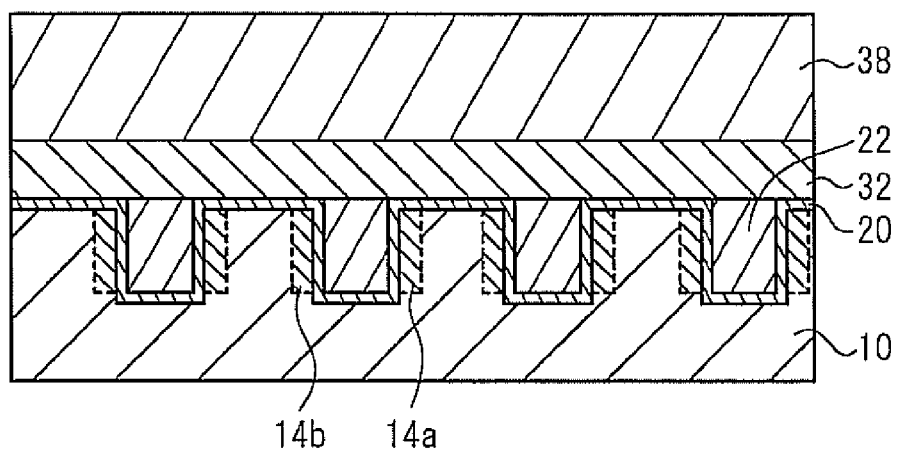
FIG. 3B is a sectional view of the channel region taken along line B-B, according to one embodiment.

FIG. 3A is a sectional view the source-drain region 12 of FIG. 2 taken along line A-A, and FIG. 3B is a sectional view of the channel region taken along line B-B, according to one embodiment. In FIG. 3A and FIG. 3B, an ONO film 20 is applied on both side surfaces and a bottom surface of the trench 30. The wordline 22 is provided in the trench 30 via the ONO film 20. In FIG. 3A, the source-drain regions 12 are formed in the semiconductor substrate 10 at both sides of the trench 30. In FIG. 3B, no source-drain region 12 is formed, but channel regions 14a and 14b are formed in the semiconductor substrate 10 at both sides of the trench 30. In addition, as illustrated in FIG. 3A and FIG. 3B, an inter-layer insulation film 32 is formed on the semiconductor substrate 10. The inter-layer insulation film 32 contains the plug metals 34 which pierce through the film to connect to the source-drain region 12. The interconnection layers 36 are also formed on the inter-layer insulation film 32 to connect to the plug metals 34. The protection film 38 is further formed on the inter-layer insulation film 32.

Figure 4:
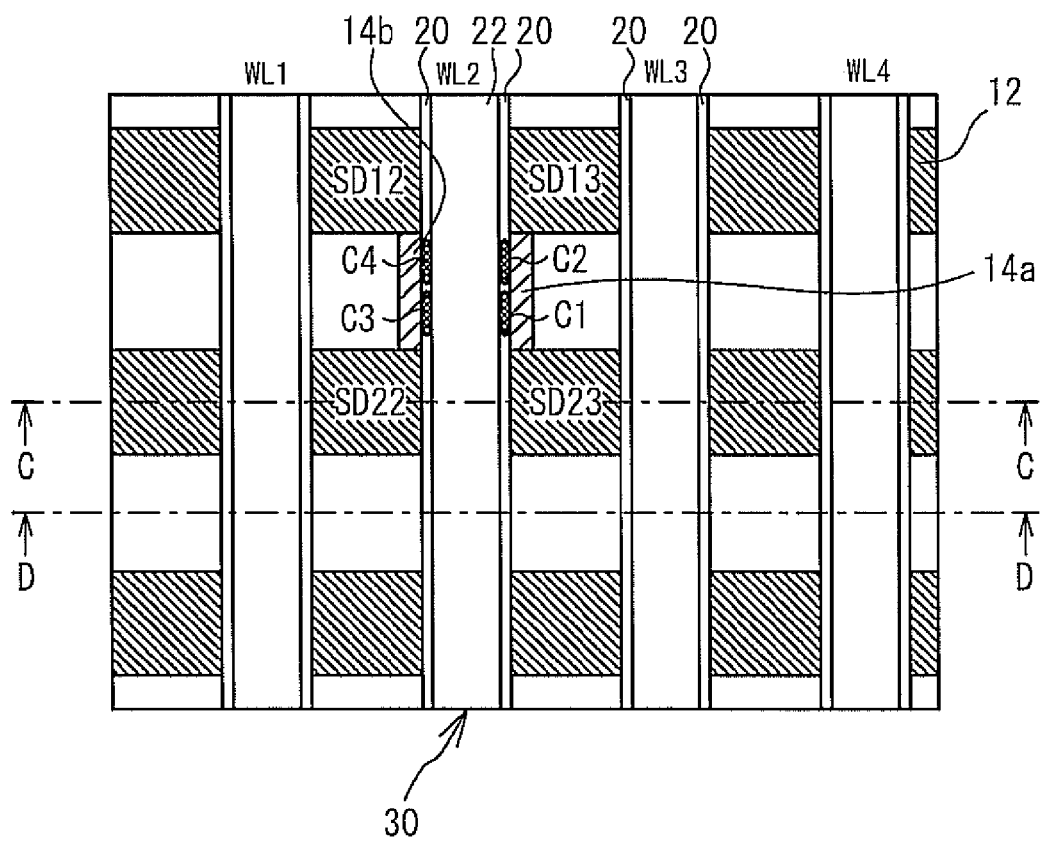
FIG. 4 is another perspective view of the exemplary flash memory of FIG. 2, according to one embodiment.

FIG. 4 is another perspective view of the exemplary flash memory of FIG. 2, according to one embodiment. In FIG. 4, the interconnection layers 36 and the plug metals 34 shown in FIG. 2 are not shown for the purpose of explaining the operation of the flash memory according to the first embodiment. As shown in FIG. 4, charge storage regions C1 through C4 are formed in the ONO film 20 using the source-drain regions 12 at both sides of WL2 as the wordlines 22 (e.g., SD12, SD13, SD 22 and SD23). The charge storage regions C1 through C4 in the ONO film 20 are formed in the ONO film 20.

Assuming that the ML1 and the ML3 shown in FIG. 2 respectively serve as the source potential and the positive high potential, the SD13 and the SD23 shown in FIG. 4 are allowed to function as the source and the drain, where a positive high voltage is applied to the SD23. When the positive voltage is applied to the WL2, the electrons are accelerated in the channel region 14a in the semiconductor substrate 10. Hot electrons are implanted into the ONO film 20 at the end of the SD23 of the channel region 14a such that the electrons are stored in the charge storage region C1 (e.g., data writing). At this time, as the ML2 and the ML4 shown in FIG. 2 are released, no potential is applied to the SD12 and the SD22 in FIG. 4. Hot electrons, thus, are not generated in the channel region 14b in the semiconductor substrate 10. Accordingly, no electron is stored in the charge storage region C3.

Figure 5A:
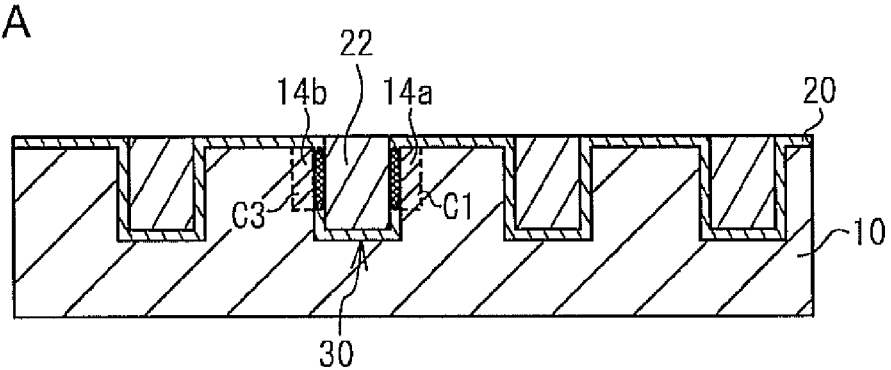
FIG. 5A is a sectional view taken along line D-D shown in FIG. 4 (sectional view of the channel region)
Figure 5B:
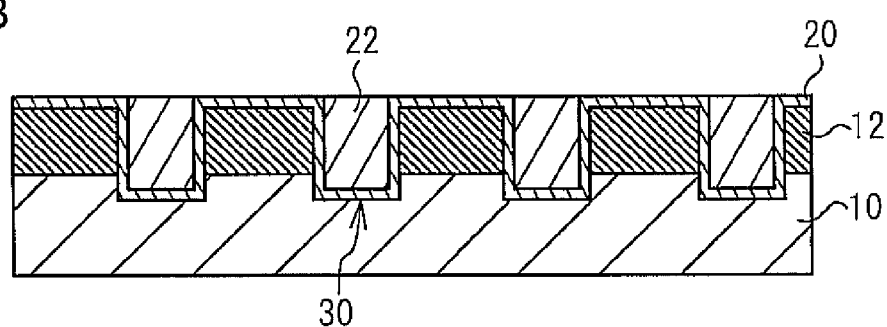
FIG. 5B is a sectional view taken along line C-C shown in FIG. 4 (sectional view of the source-drain region), according to one embodiment.

By setting the SD13 as the source potential, the SD23 as the positive high potential, and the WL2 as the negative potential, an ionized hole is implanted into the ONO film 20 at the end of the SD23 of the channel region 14a so as to erase the electrons in the charge storage region C1 (e.g., erasing data). At this time, the electrons in the charge storage region C3 are not erased. By setting the SD13 as the drain, and the SD23 as the source, it is possible to read out whether the electrons are stored in the charge storage region C1 (e.g., reading data). By switching the potential between the ML3 and ML1 shown in FIG. 2, electrons can be stored in or erased from the charge storage region C2 in the ONO film 20 at the end of the SD13 of the channel region 14a. Further, it is possible to read out whether electrons are stored in the charge storage region C2. The use of the ML2 and ML4 shown in FIG. 2 allows electrons to be stored in, erased or read out from the charge storage regions C3 and C4 independently from the charge storage regions C1 and C2 shown in FIG. 4. FIG. 5A is a sectional view taken along line D-D shown in FIG. 4 (sectional view of the channel region), and FIG. 5B is a sectional view taken along line C-C shown in FIG. 4 (sectional view of the source-drain region), according to one embodiment.

Figure 6:
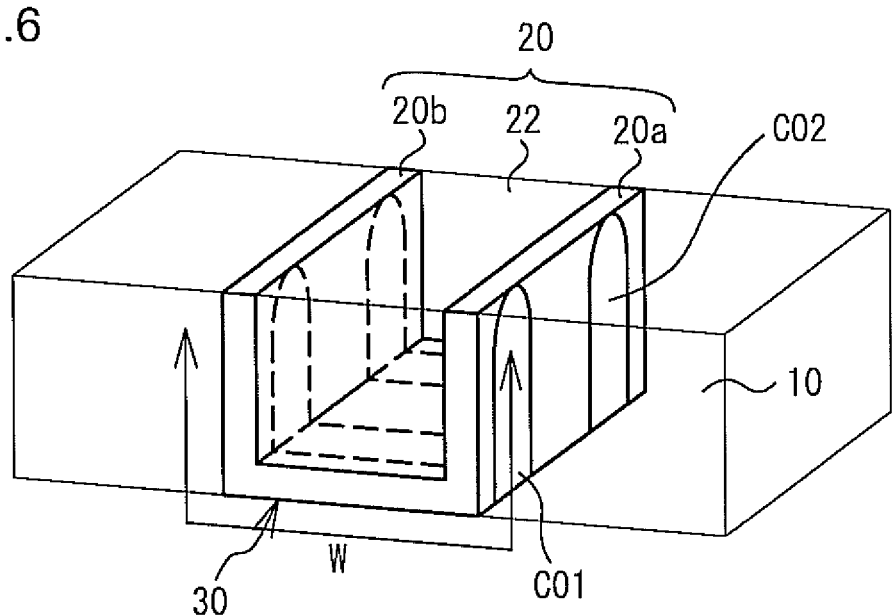
FIG. 6 is a perspective view illustrating an exemplary charge storage region of a flash memory, according to one embodiment.

FIG. 6 is a perspective view illustrating an exemplary charge storage region of a flash memory, according to one embodiment. In FIG. 6, the trench 30 is formed in the semiconductor substrate 10, and the ONO film 20 is applied on both side surfaces and the bottom surface of the trench 30 to bury the wordline 22 therein. The bit line (not shown) is formed on the semiconductor substrate 10 to intersect with the wordline 22. As illustrated in FIG. 6, the structures of the charge storage regions C01 and C02 are formed in a U shape such that the actual width of the charge storage regions C01 and C02 is significantly greater than the width of the wordline 22. This makes it possible to reduce the width of the wordline 22 while maintaining the width of the storage regions C01 and C02 greater than 0.2 um, which is the minimum width at which the charge loss in the charge storage regions C01 and C02 becomes significant.

Figure 7:
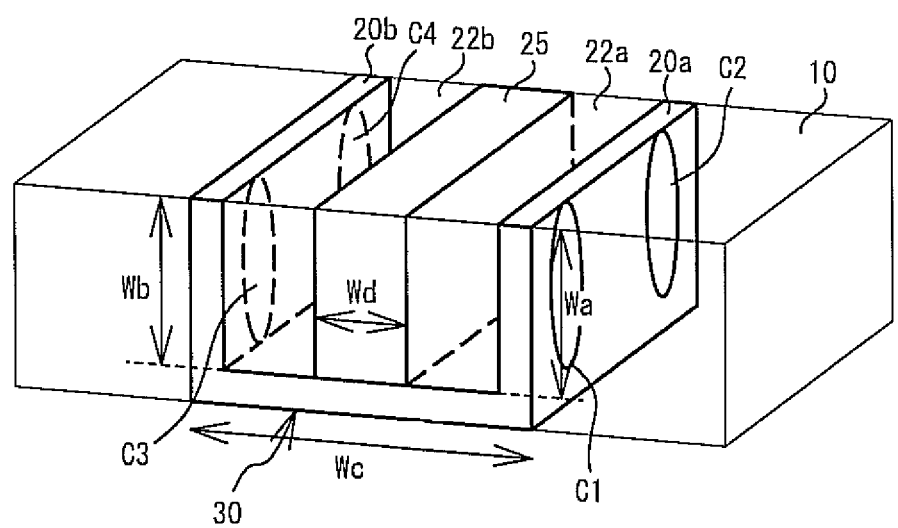
FIG. 7 is a perspective view illustrating another exemplary charge storage region of a flash memory, according to one embodiment.

FIG. 7 is a perspective view illustrating another exemplary charge storage region of a flash memory, according to one embodiment. In FIG. 7, an insulation portion 25 is formed in the trench 30 to electrically separate the wordline 22a in contact with the ONO film 20a from the wordline 22b in contact with the ONO film 20b. The electrically separated wordlines 22a and 22b allow electrons to be stored, erased or read from the charge storage regions C1 and C2 in the ONO film 20a, and the charge storage regions C3 and C4 in the ONO film 20b, independently. If the trench 30 is formed with an adequate depth (e.g., approximately 0.2 um), the width (Wa) of the charge storage regions C1 and C2, and the width (Wb) of the charge storage regions C3 and C4 are long enough to suppress the charge loss. Accordingly, the width of the wordline can be reduced. It is appreciated that the width (Wd) of the insulation portion 25 formed in the trench 30 is set at the minimum dimension (e.g., 0.1 um) which has to be met by the current photolithographic technology. Accordingly, the width (Wc) of the trench 30 can be set at two or three times wider than the minimum dimension.

Figure 8:
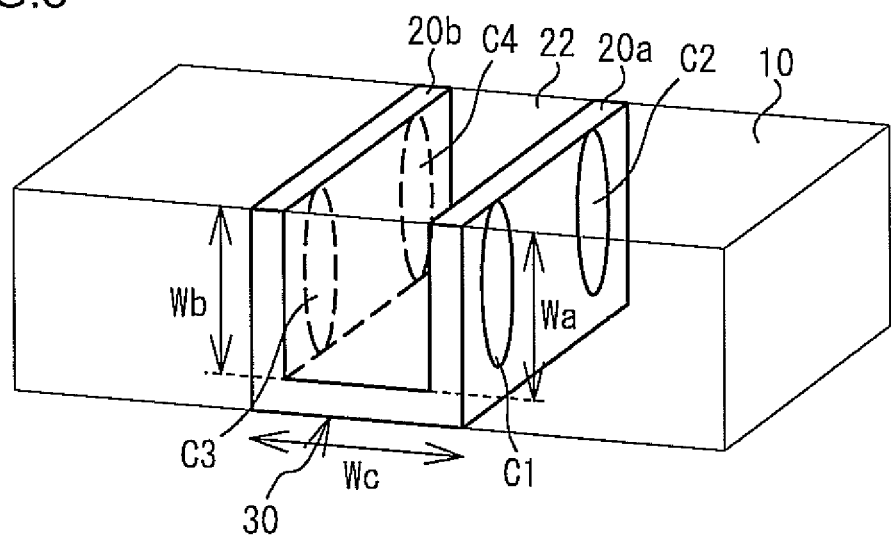
FIG. 8 is a perspective view illustrating yet another exemplary charge storage region of a flash memory, according to one embodiment.

FIG. 8 is a perspective view illustrating yet another exemplary charge storage region of a flash memory, according to one embodiment. In FIG. 8, electrons may be stored, erased or read from the charge storage regions C1 and C2 in the ONO film 20a formed on one side surface of the trench 30, and the charge storage regions C3 and C4 in the ONO film 20b formed on the other side surface independently. The width (Wc) of the trench 30 is set to the minimum dimension of the photolithography. Further, if the depth of the trench 30 is set greater than an appropriate depth (e.g., approximately 0.2 um), the width (Wa) of the charge storage regions C1 and C2, and the width (Wb) of the charge storage regions C3 and C4 are long enough to suppress the charge loss in the charge regions. Accordingly, the width of the wordline can be reduced.

Figure 9A:
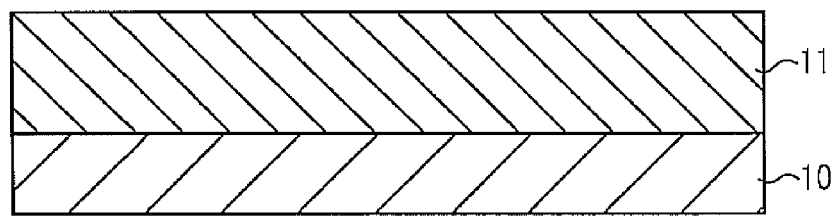
FIGS. 9A through 10B are sectional views illustrating exemplary steps of manufacturing a flash memory, according to one embodiment.
Figure 9B:
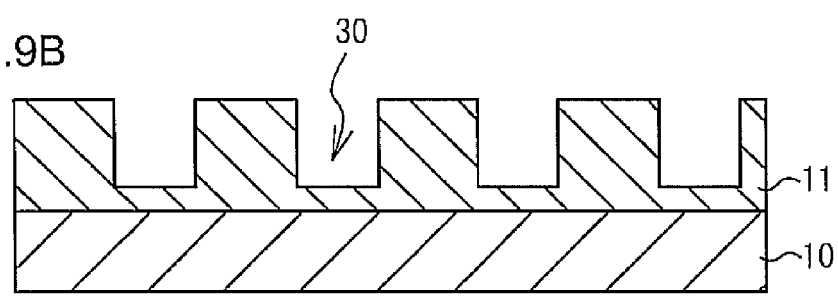

FIGS. 9A through 10B are sectional views illustrating exemplary steps of manufacturing a flash memory, according to one embodiment. In FIG. 9A, boron (B) ions are implanted into the P-type silicon semiconductor substrate 10 to form a P-type threshold adjustment region 11 for adjusting the threshold voltage. Formation of the threshold adjustment region 11, which is not shown in FIGS. 3A, 3B, 5A and 5B, is not required. In FIG. 9B, the semiconductor substrate 10 is etched to form the trench 30. The formation of the threshold adjustment region 11 shown in FIG. 9A may be performed after the formation of the trench 30 shown in FIG. 9B.

Figure 9C:
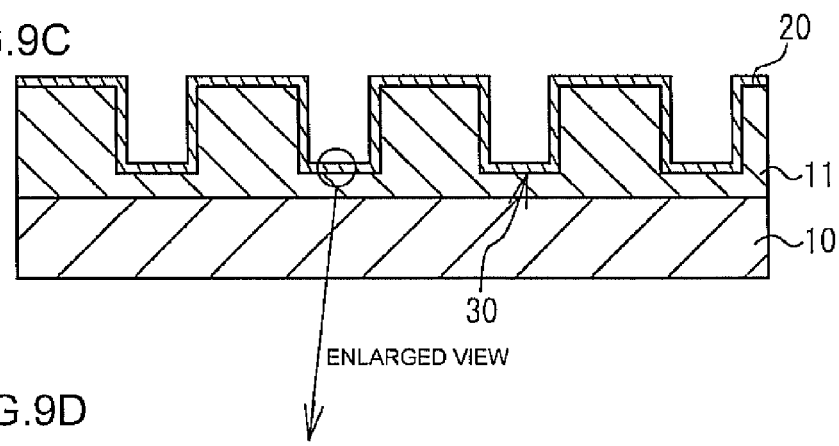
Figure 9D:
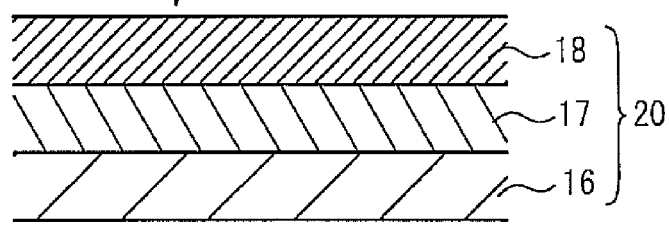
Figure 10A:
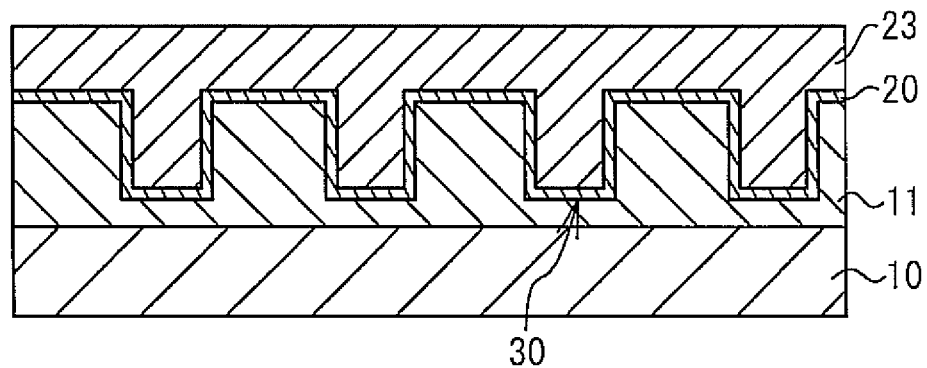
Figure 10B:
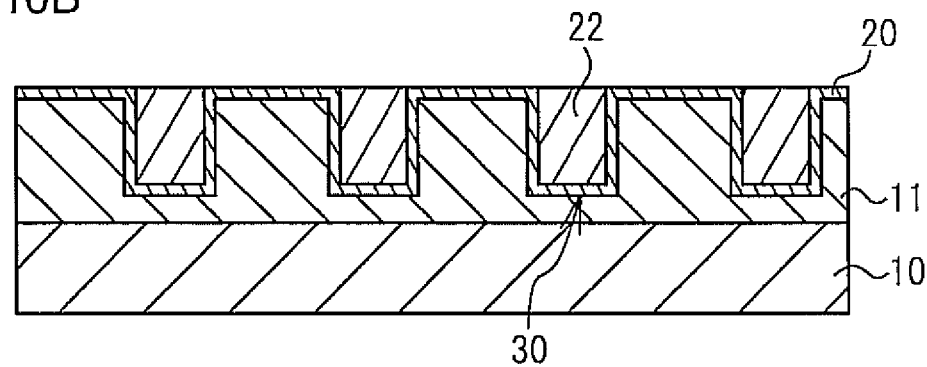

In FIG. 9C and FIG. 9D, the ONO film 20 is applied on both side surfaces and the bottom surface of the trench 30, and surface portions on the semiconductor substrate 10 which border the adjacent trenches 30 (threshold adjustment region 11). The ONO film 20 may be produced by sequentially forming a tunnel oxide film 16 (e.g., a silicon oxide film processed by a thermal CVD), a trap layer 17 (e.g., a silicon nitride film processed by a plasma CVD), and a top oxide film 18 (e.g., a silicon oxide film processed by the thermal CVD). In FIG. 10A, a conductive film 23 as a polysilicon is formed on the semiconductor substrate 10 to bury the trenches 30. In FIG. 10B, the conductive film 23 on the ONO film 20 is polished through a chemical mechanical polish (CMP) process so as to produce the wordline 22 buried in the trench 30 via the ONO film 20.

FIG. 11A through FIG. 11D are sectional views illustrating exemplary steps of manufacturing a flash memory, according to one embodiment. Particularly, FIG. 11A and FIG. 11B are sectional views of the source-drain regions taken along line A-A of FIG. 2, whereas FIG. 11C and FIG. 11D are sectional views of the channel regions taken along line B-B of FIG. 2. In FIG. 11A, ions such as Arsenic (As) ions are implanted into the semiconductor substrate 10 (threshold adjustment region 11) so as to form the N-type source-drain regions 12 at both sides of the trench 30. In FIG. 11C, a photoresist 40 is formed on the semiconductor substrate 10 to prevent forming of the source-drain region 12 thereon.

In FIG. 11B and FIG. 11D, nickel (Ni) is applied to the entire surface, and subjected to the thermal processing to form a Ni silicide film 24 on the wordline 22. This makes it possible to reduce the resistance of the wordline 22. The silicide film 24 is not shown in FIGS. 3A, 3B, 5A and 5B. A silicon oxide film as the inter-layer insulation film 32 is applied onto the semiconductor substrate 10 and the silicide film 24. In FIG. 11B, a contact hole connected to the source-drain region 12 is formed and filled with, for example, W (tungsten) to form the plug metal 34. The interconnection layer 36 formed of Al (aluminum) connected to the plug metal 34 is formed on the inter-layer insulation film 32. This makes it possible to form the ML1 (the first interconnection layer) connected to the SD13 and the ML2 (the second interconnection layer) connected to the SD12 (of FIG. 4) simultaneously, thus simplifying the manufacturing step.

The ONO film 20 on the semiconductor substrate 10 (threshold adjustment region 11) between the adjacent trenches 30 shown in FIG. 10B may be eliminated partially or entirely. Preferably, the top oxide film 18 of the ONO film 20 is eliminated such that the trap layer 17 is exposed. The trap layer 17 as the silicon nitride film is required to be exposed on the source-drain region 12 upon formation of the silicide film 24 on the wordline 22 shown in FIGS. 11B and 11D so as not to form the silicide film on the source-drain region 12. In the case where the conductive film 23 formed of metal and WSi (tungsten silicide) is used, the resistance of the wordline 22 is sufficiently low. Accordingly, the formation of the silicide film 24 as shown in FIGS. 11B and 11D is not required. In this case, the ONO film 20 of the semiconductor substrate 10 between the adjacent trenches 30 may be eliminated entirely in the step shown in FIG. 10B. The protection film 38 as the silicon oxide film is formed on the inter-layer insulation film 32 to produce the flash memory according to the first embodiment as shown in FIGS. 2 to 3B.

Figure 12A:
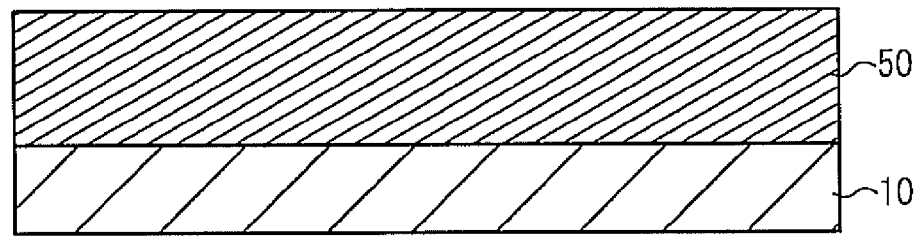
FIG. 12A through 14 are sectional views illustrating exemplary steps of manufacturing a flash memory, according to one embodiment.

FIG. 12A through 14 are sectional views illustrating exemplary steps of manufacturing a flash memory, according to one embodiment. In FIG. 12A, a P-type polysilicon layer 50 is formed on the semiconductor substrate 10. In FIG. 12B, the trench 30 is formed in the polysilicon layer 50. In FIG. 12C, the ONO film 20 is formed on both side surfaces and the bottom surface of the trench 30 in a similar fashion described in FIG. 9C.

Figure 13A:
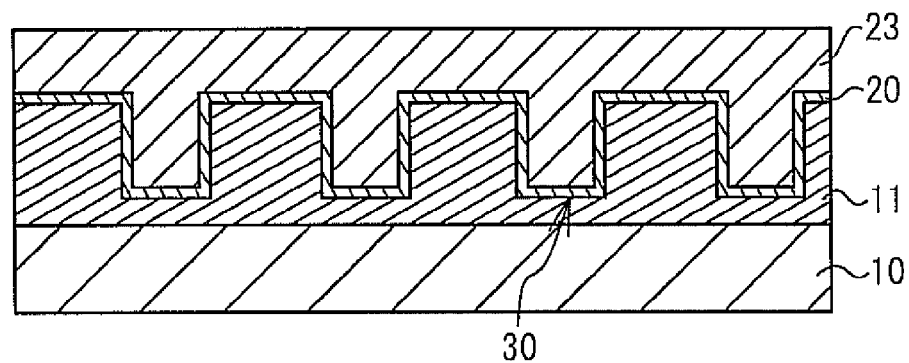
Figure 13B:
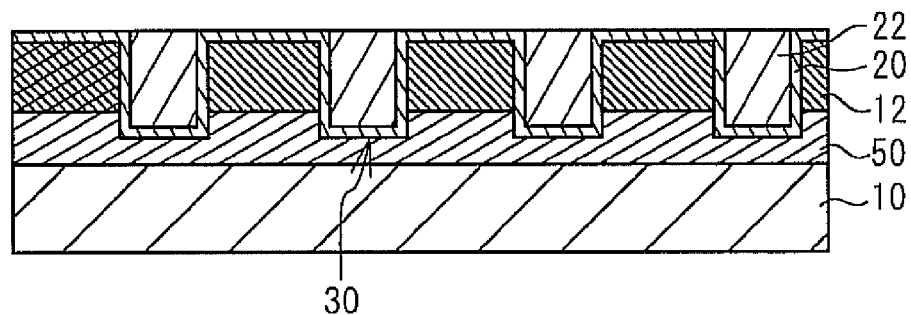
Figure 13C:
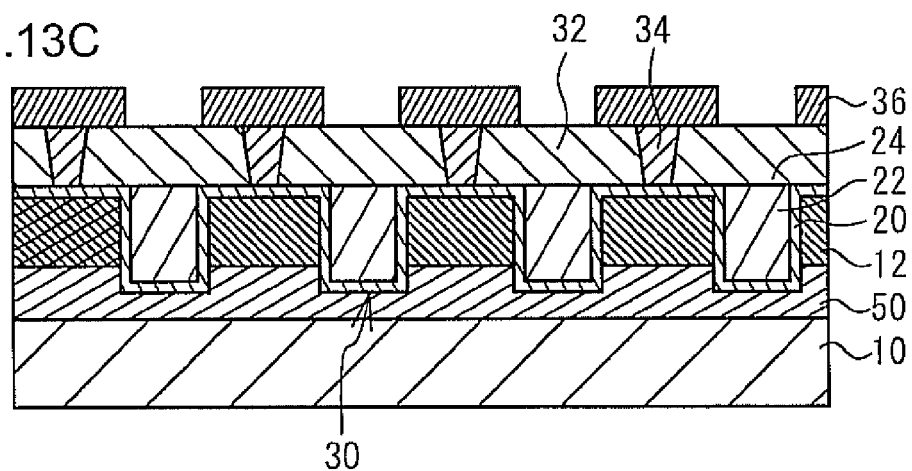

In FIG. 13A, the conductive film 23 is formed on the semiconductor substrate 10 to bury the trench 30 as in FIG. 10A. In FIG. 13B, the conductive film 23 is polished in the same manner as the steps shown in FIGS. 10B, 11A and 11C so as to produce the wordline 22 that is buried in the trench 30. The source-drain regions 12 are formed at both sides of the trench 30. In FIG. 13C, the inter-layer insulation film 32, the plug metal 34 and the interconnection layer 36 are formed in the same manner as the steps shown in FIGS. 11B and 11D.

Figure 14:
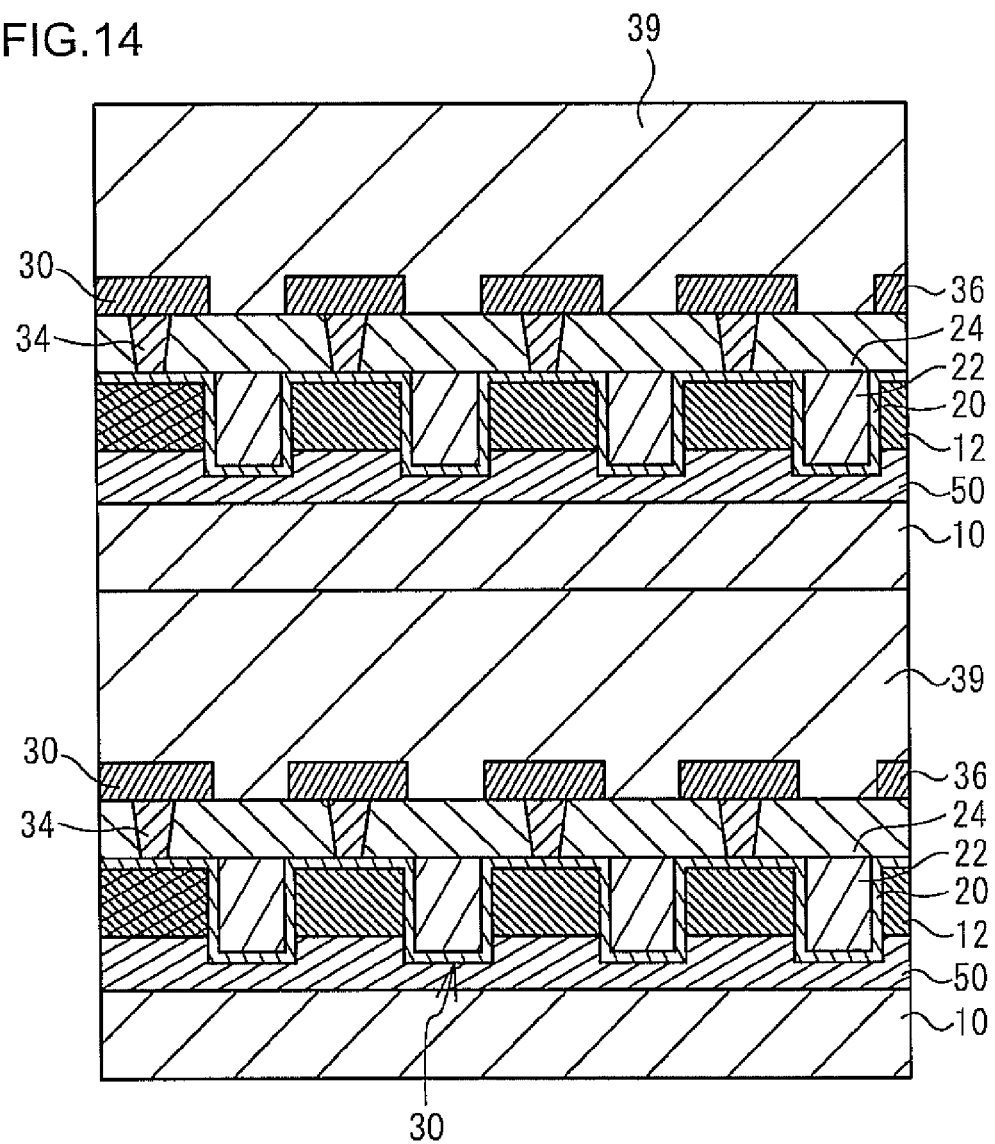

Referring to FIG. 14, an insulation layer 39 is formed on the inter-layer insulation film 32 and the interconnection layer 36. The polysilicon layer 50 is formed above the insulation layer 39. The steps shown in FIGS. 12A to 13B are repeatedly performed to layer the memory cells.

Figure 12B:
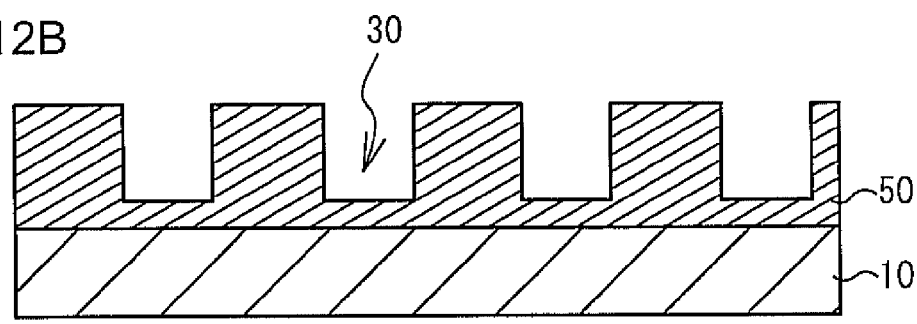
Figure 12C:
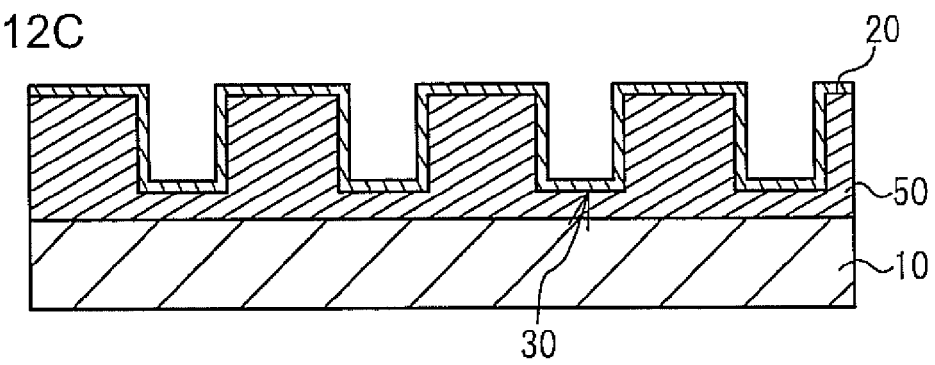

The polysilicon layer 50 is formed on the semiconductor substrate 10 as shown in FIG. 12A, and the trench 30 is formed in the polysilicon layer 50 as shown in FIG. 12B. This makes it possible to form the source-drain regions 12 and the channel region in the polysilicon layer 50. As shown in FIG. 14, the polysilicon layer 50 may be formed above the insulation layer 39 to allow the memory cells to be layered. FIG. 14 shows that two memory cells are layered. However, three or more memory cells may be layered.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A semiconductor device, comprising:
a semiconductor layer including a trench extending in a first direction;
a plurality of charge storage layers formed at both side surfaces of the trench;
a first wordline buried in the trench and formed in the semiconductor layer in contact with the plurality of charge storage layers wherein the first wordline is laterally confined within vertical boundaries established by sidewalls of the trench;
a plurality of source-drain regions formed in the semiconductor layer at both sides of the trench; and
a plurality of interconnection layers extending in a second direction and parallel to one another, and configured to be selectively coupled to the plurality of source-drain regions, wherein each of the plurality of interconnection layers is coupled to only one of the plurality of source-drain regions along the first direction,
wherein the second direction is perpendicular to the first direction.

2. The semiconductor device of claim 1, wherein the plurality of charge storage layers comprise an oxide-nitride-oxide (ONO) film.

3. The semiconductor device of claim 1, wherein the plurality of source-drain regions are formed along the first direction.

4. The semiconductor device of claim 1, wherein the first wordline is less than 0.2 um in width.

5. The semiconductor device of claim 1, wherein the charge storage layers formed at the both side surfaces of the trench are connected by respective insulation films formed at a bottom of the trench across the plurality of charge storage layers.

6. The semiconductor device of claim 1, wherein the plurality of charge storage layers are separated by an insulation portion formed in the first direction inside the trench and adapted to separate the first wordline from a second wordline, wherein the plurality of charge storage layers formed at the both side surfaces of the trench are electrically separated by the insulation portion.

7. The semiconductor device of claim 1, wherein four of the plurality of interconnection layers are each coupled to one of four of the plurality of source-drain regions surrounding a unit of the charge storage layers.

8. The semiconductor device of claim 7, wherein a channel is formed between two of the four of the plurality of source-drain regions along the first direction and on a same side of the trench.

9. The semiconductor device of claim 7, wherein the unit of the charge storage layers comprises four charge storage regions.

10. The semiconductor device of claim 1, wherein the semiconductor layer further comprises a polysilicon layer formed on a semiconductor substrate, and wherein the trench is formed on the polysilicon layer extending into the semiconductor substrate, and wherein the plurality of source-drain regions are formed in the polysilicon layer.

11. The semiconductor device of claim 1, further comprising:
a silicide layer including a planar bottom surface that contacts top surfaces of the first word line and the plurality of charge storage layers.

12. A flash memory device, comprising:
a semiconductor layer including a polysilicon layer formed on a semiconductor substrate, wherein a trench is formed thereon extending in a first direction;
a plurality of charge storage layers formed at both side surfaces of the trench;
a first wordline buried in the trench and in contact with the plurality of charge storage layers;
a plurality of source-drain regions formed in the semiconductor layer at both sides of the trench, wherein the plurality of source-drain regions are formed in the polysilicon layer;
an inter-layer insulation film formed on the semiconductor layer covering the trench and the plurality of source drain regions; and
a plurality of elongated and continuous interconnection layers formed on the inter-layer insulation film, wherein each of the plurality of interconnection layers, extends in a second direction that is perpendicular to the first direction, and configured to be selectively coupled to only one of the plurality of source-drain regions along the first direction.

13. The flash memory device of claim 12, wherein the plurality of charge storage layers are separated by an insulation portion formed in the first direction parallel to the sidewalls of the trench and adapted to separate the first wordline from a second wordline.

14. The flash memory device of claim 12, wherein the plurality of interconnection layers are electrically coupled to the plurality of source-drain regions via a plurality of pad metals through the inter-layer insulation film.

15. The flash memory device of claim 12, further comprising:
a silicide layer having a planar bottom surface that contacts top surfaces of the first word line and the plurality of charge storage layers.

16. A memory device, comprising:
a semiconductor substrate;
a plurality of trenches formed on the semiconductor substrate, extending in a first direction and parallel to one another;
an oxide-nitride-oxide (ONO) layer formed on each side surface of the plurality of trenches;
a wordline formed at least partially within each of the plurality of trenches and in contact with the ONO layers;
a first and a second plurality of source-drain regions formed in the semiconductor substrate, wherein the first and the second plurality of source-drain regions are formed respectively on opposite sides of the plurality of trenches; and a plurality of elongated and continuous interconnection layers extending in a second direction that is perpendicular to the first direction, wherein each of the plurality of interconnection layers is configured to be electrically coupled to only the first or only the second plurality of source-drain regions along the second direction and only one of the first or the second plurality of source-drain regions along one of the trenches.

17. The memory device of claim 16, wherein each of two adjacent interconnection layers is configured to be coupled to the first and the second plurality of source-drain regions respectively.

* * * * *